United States Patent [19]
Li et al.

[11] Patent Number: 6,147,300
[45] Date of Patent: Nov. 14, 2000

[54] ELECTROMAGNETIC INTERFERENCE (EMI) SHIELD APPARATUS AND METHOD

[75] Inventors: Hong Li, Carol Stream; Kenneth S. Laughlin, Arlington Heights; Amir Koradia, Palatine; Sajid Patel, Des Plains, all of Ill.

[73] Assignee: 3COM Corporation, Rolling Meadows, Ill.

[21] Appl. No.: 09/012,943

[22] Filed: Jan. 26, 1998

[51] Int. Cl.[7] .................................................. H05K 9/00
[52] U.S. Cl. ......................... 174/35 R; 348/836; 345/905
[58] Field of Search ........................... 174/35 R, 35 GC; 361/816, 818, 752, 800; 455/300; 348/820, 836; 345/905

[56] References Cited

U.S. PATENT DOCUMENTS

| | | |
|---|---|---|
| 4,384,165 | 5/1983 | Loving, Jr. et al. ................ 174/35 GC |
| 5,398,169 | 3/1995 | Gorenz, Jr. et al. .................... 361/818 |
| 5,608,188 | 3/1997 | Choon et al. .......................... 174/35 R |

*Primary Examiner*—Kristine Kincaid
*Assistant Examiner*—Hung V Ngo
*Attorney, Agent, or Firm*—Baniak Nicholas Pine & Gannon

[57] ABSTRACT

An apparatus and method for shielding electromagnetic interference (EMI) includes a cover having a body portion and an angled flange portion, the angled flange portion substantially surrounding a perimeter portion of the body portion to allow a force applied in a direction substantially perpendicular to the body portion to deflect the angled flange portion and bias the angled flange portion against a contact surface to form a positive contact between the angled flange portion and the contact surface thereby shielding EMI.

8 Claims, 3 Drawing Sheets

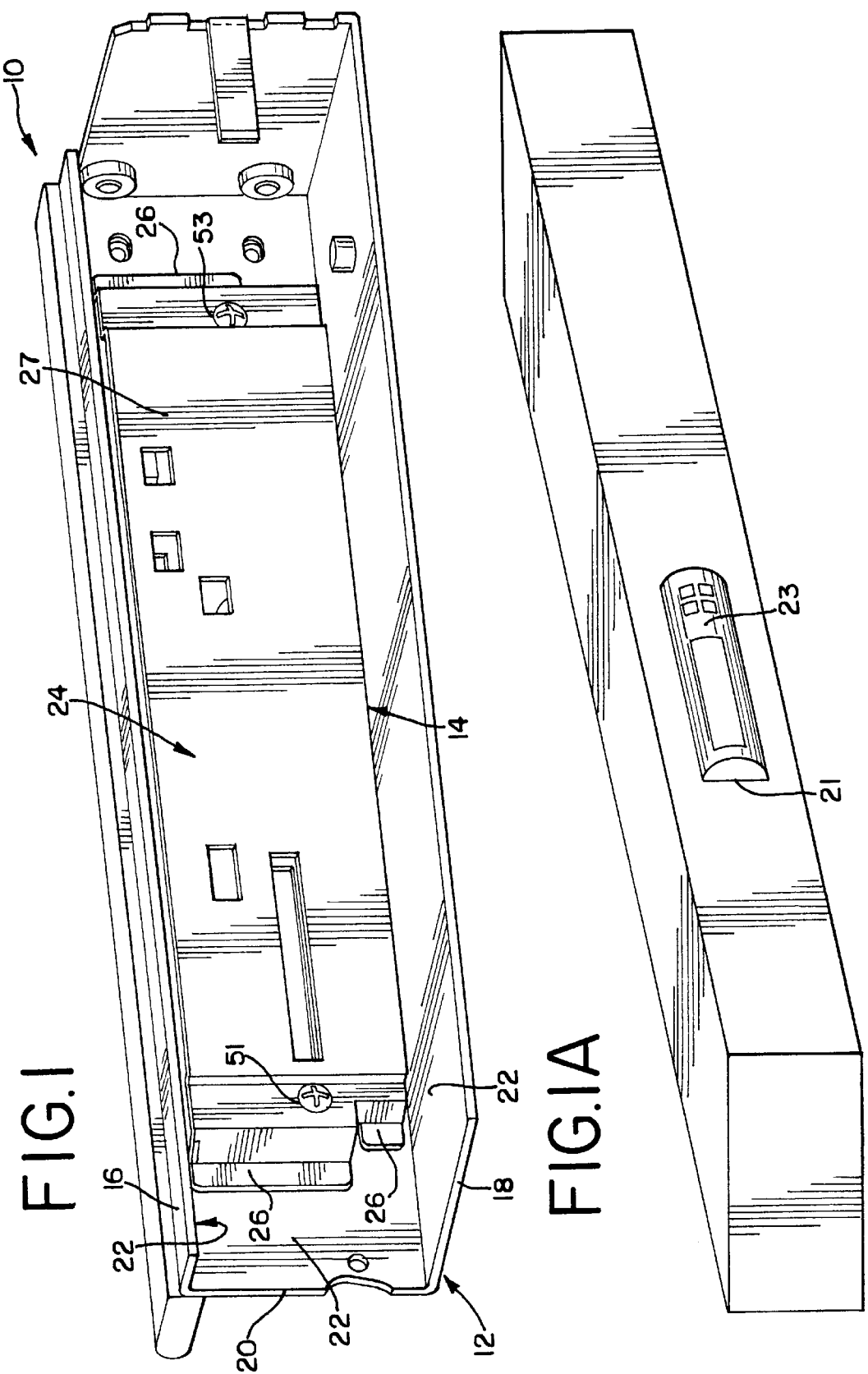

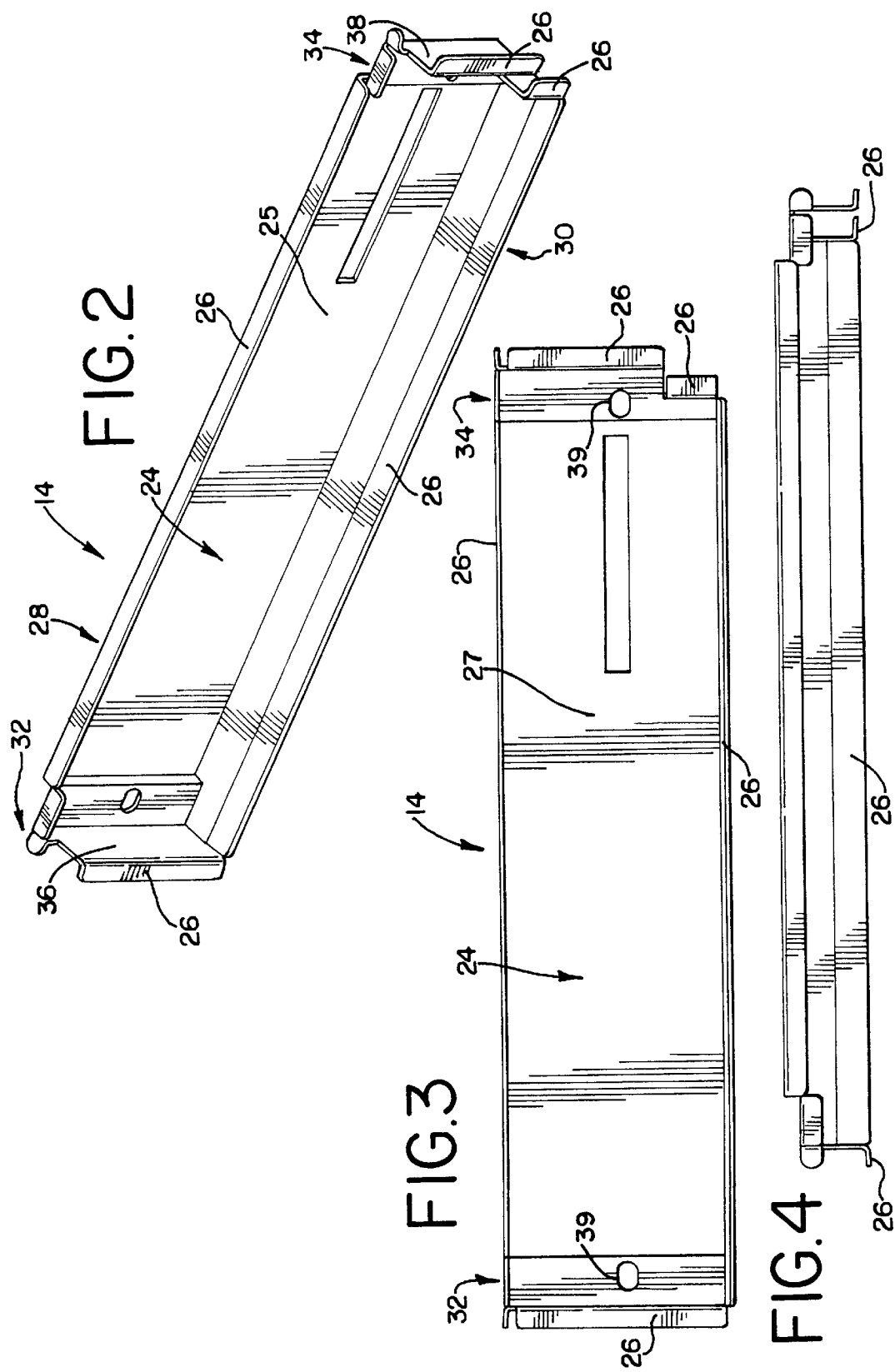

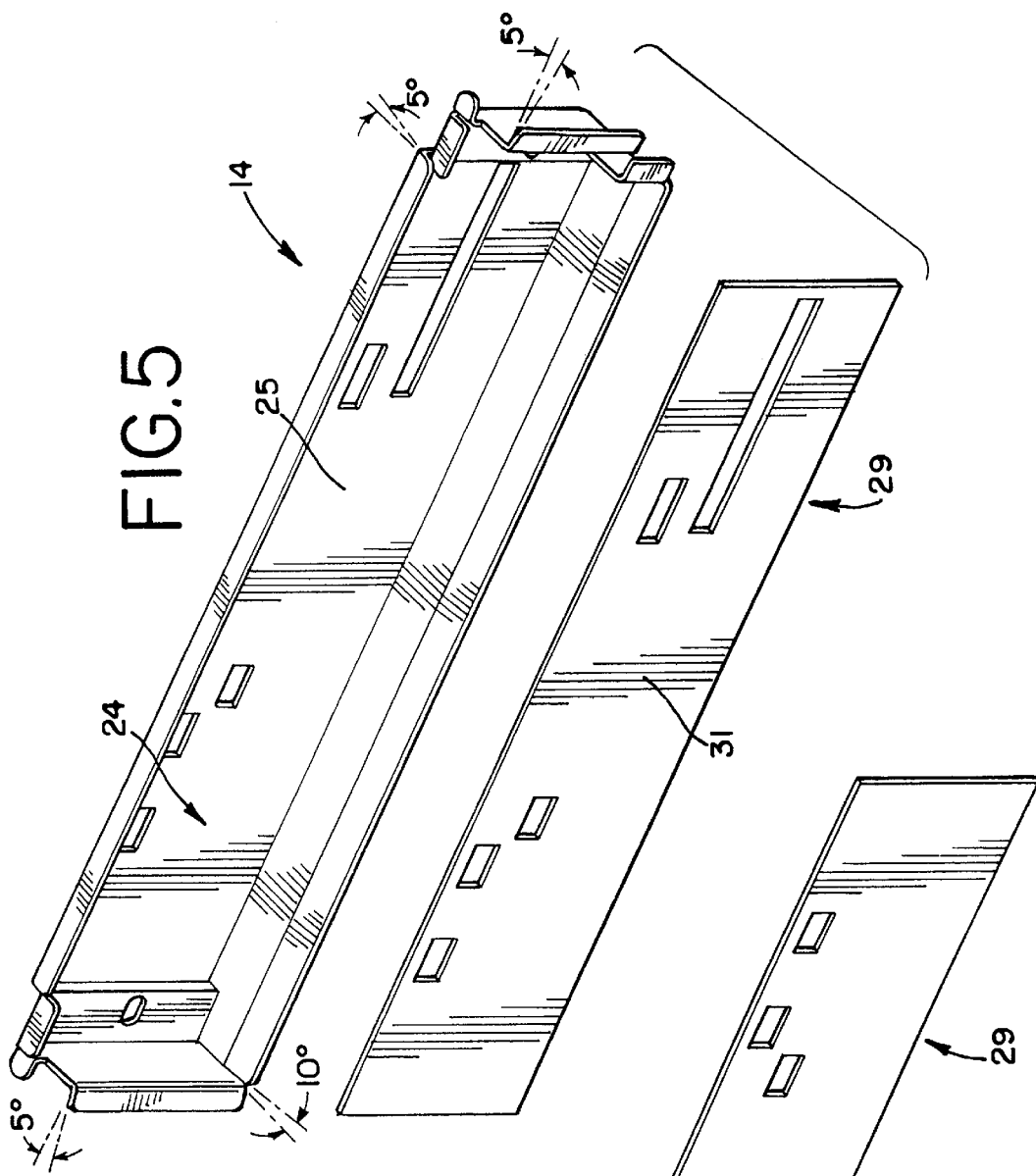

ELECTROMAGNETIC INTERFERENCE (EMI) SHIELD APPARATUS AND METHOD

FIELD OF THE INVENTION

This invention relates generally to the field of shielding electromagnetic radiation to reduce excessive electromagnetic interference (EMI) and, in particular, to prevent unacceptable levels of electromagnetic radiation from exiting the housing of an electronic device to meet U.S. and foreign EMI emissions standards.

BACKGROUND OF THE INVENTION

Most electronic devices have a rigid housing to protect the internal electronic components. Typically, the housing has several openings for receiving a variety of electronic components used to operate the device such as, for example, a liquid crystal display (LCD) assembly. Even after these components are secured to the housing, the openings in the housing need to be properly sealed from the inside of the housing to prevent electromagnetic radiation generated by the internal electronic components of the device from exiting the housing. Excessive electromagnetic interference (EMI) is a widespread problem in many electronic devices, especially in the high speed network systems products. These electronic devices must meet very stringent emissions standards in the United States and in other foreign countries.

Shielding devices are available which can be used to reduce EMI emissions which exit through openings formed in the housing of an electronic device. Typically, these devices are metal enclosures which are secured to the back of the electronic components within the device. The disadvantage of this arrangement is that the perimeter of the metal enclosure is not in positive and continuous contact with the housing of the device, and as a result, electromagnetic radiation can leak out of the housing around the perimeter of the electronic component.

Metal enclosures have also been secured to the back surface of an electronic component where the perimeter edge of the metal enclosure contacts the housing of the device. However, if a particular device has parts which are out of tolerance, the perimeter edge of the metal enclosure may not be in positive and continuous contact with the housing which may result in excessive EMI emissions.

Flexible metallic tape has also been used to prevent electromagnetic radiation from exiting an opening formed in a housing of an electronic device. During the manufacturing process, the metallic tape is manually applied over the back of the electronic component to seal the opening. There are a number of disadvantages to using metallic tape as a shield, including the high costs associated with the manual application of the tape. Moreover, because the manufacturing process is very labor intensive and involves the manual application of the tape, it is very difficult to achieve a consistent and uniform application of the tape from one device to another.

Accordingly, it would be desirable to have an EMI shielding apparatus that overcomes the disadvantages described above and to provide a simple, and cost effective EMI shielding apparatus.

SUMMARY OF THE INVENTION

One aspect of the invention provides an electromagnetic interference (EMI) shield apparatus. A cover includes a body portion and a flange portion. The flange portion substantially surrounds a perimeter portion of the body portion to allow a force applied in a direction substantially perpendicular to the body portion to deflect the flange portion and bias the flange portion against a contact surface to form a positive contact between the flange portion and the contact surface thereby shielding EMI. The flange portion may be angled at least about five degrees with respect to the contact surface to allow the flange portion to deflect when the force is applied in a direction substantially perpendicular to the body portion to form the positive contact between the flange portion and the contact surface. The body portion may have a rectangular shape including a top longitudinal side, a bottom longitudinal side, a first end and a second end. The cover may be formed from a single piece of conductive material such as tin plated cold rolled steel.

Another aspect of the invention provides an electromagnetic interference (EMI) shield apparatus. A housing includes an opening formed therein for receiving at least one electronic device, the housing includes a contact surface. A cover secured to the housing includes a body portion and a flange portion, the flange portion substantially surrounding a perimeter portion of the body portion to allow a force applied in a direction substantially perpendicular to the body portion to deflect the flange portion and bias the flange portion against the contact surface of the housing to form a positive contact between the flange portion and the contact surface of the housing thereby preventing electromagnetic radiation from exiting the housing. The flange portion may be angled at least about five degrees with respect to the contact surface of the housing to allow the flange portion to deflect when the force is applied in a direction substantially perpendicular to the body portion to form a positive contact between the flange portion and the contact surface of the housing thereby preventing electromagnetic radiation from exiting the housing. The body portion may include an inner surface and an outer surface, and an insulative strip substantially covering the inner surface. The insulative strip may include a front surface and a back surface, the back surface may include an adhesive material for securing the insulative strip to the inner surface of the body. The body portion may have a rectangular shape including a top longitudinal side, a bottom longitudinal side, a first end including an first end wall portion and a second end including a second end wall portion. The flange portion may be oriented along the top longitudinal side, the bottom longitudinal side, the first end wall portion, and the second end wall portion. The flange portion oriented along the first end wall may extend from the first end wall portion, and the flange portion oriented along the second end wall may extend from the second end wall portion. The housing may include a top wall, a bottom wall, and a side wall. The flange portion oriented along the top longitudinal side may contact the top wall of the housing. The flange portion oriented along the bottom longitudinal side may contact the bottom wall of the housing. The flange portion oriented along the first and second end wall portions may contact the side wall of the housing. The flange portion oriented along the top longitudinal side may be angled at least about five degrees from the top wall of the housing. The flange portion oriented along the bottom longitudinal side may be angled at least about ten degrees from the bottom wall of the housing. The flange portion oriented along the first and second end wall portions may be angled at least about five degrees from the side wall of the housing. The electronic device may be a liquid crystal display (LCD) assembly including a LCD.

Another aspect of the invention provides a method for shielding electromagnetic interference (EMI). A housing including an opening formed therein for receiving at least one electronic device is provided. The housing includes a contact surface. A cover secured to the housing including a body portion and a flange portion is also provided. The flange portion substantially surrounds a perimeter portion of the body portion. A force is applied in a direction substantially perpendicular to the body portion. The flange portion is deflected and biased against the contact surface of the housing to form a positive contact between the flange portion and the contact surface of the housing thereby preventing electromagnetic radiation from exiting the housing. The cover may be insulated from the electronic device. The electronic device may be a liquid crystal display (LCD) assembly including a LCD. Electromagnetic radiation may be prevented from exiting thorough the LCD assembly.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

BRIEF DESCRIPTION OF THE DRAWINGS

FIG. 1 is a perspective view of a preferred embodiment of an EMI shield apparatus which is made in accordance with the invention;

FIG. 1A is a perspective view of a housing including an opening formed therein for receiving an electronic device.

FIG. 2 is a perspective view of the cover of the embodiment of FIG. 1.

FIG. 3 is a front view of the cover of FIG. 2.

FIG. 4 is a top view of the cover of FIG. 2.

FIG. 5 is a perspective view of an insulative strip for securing to the embodiment of FIG. 1.

FIG. 6 a back view of the insulative strip of FIG. 5.

DETAILED DESCRIPTION OF THE PRESENTLY PREFERRED EMBODIMENTS

As shown in FIGS. 1–3, a preferred embodiment of an electromagnetic interference (EMI) shield apparatus 10 includes a housing 12 and a cover 14. The housing 12 includes a top wall 16, a bottom wall 18, a side wall 20, and as shown in FIG. 1A an opening 21 formed within the housing 12 for receiving an electronic device 23. The electronic device 23 may be any type of electronic component including, for example, a liquid crystal display (LCD) assembly. The housing 12 also includes a contact surface 22. The contact surface 22 may be any interior surface of the housing 12.

The cover 14 includes a body portion 24 and a flange portion 26. The body portion 24 has a rectangular shape and includes a top longitudinal side 28, a bottom longitudinal side 30, a first end 32, and a second end 34. The first end 32 includes a first end wall portion 36. The second end 34 includes a second end wall portion 38. The body portion 24 may be configured in other shapes depending on the shape of the opening formed within the housing 12 and the shape of the electronic device.

As shown in FIGS. 1–3 and 5, the body portion 24 includes an inner surface 25 and an outer surface 27. As shown in FIGS. 5–6, a preferred embodiment of the invention includes an insulative strip 29 including a front surface 31 and a back surface 33. The insulative strip 29 is preferably formed from a single piece of insulative material such as polyester, such as that supplied by Valox. The back surface 33 of the insulative strip 29 includes an adhesive material for securing the insulative strip 29 to the inner surface 25 of the body portion 24. The adhesive material may be any of the commercially available adhesives such as 3M 46A pressure treated adhesive supplied by the 3M Corporation.

Referring to FIG. 3, the cover 14 preferably includes two openings 39 formed in the body portion 24, one opening adjacent the first end 32 of the body portion 24 and another opening adjacent the second end 34 of the body portion 24. The cover 14 is preferably formed from a single piece of conductive material. In the embodiment disclosed, the conductive material is preferably tin plated cold rolled steel. The cover 14 may be formed from other types of suitable conductive material, such as, for example, copper.

Referring to FIG. 1, the cover 14 is preferably secured to the housing 12 with two screws 51, 53 which extend through the two opening 39 formed in the body portion 24. Other suitable fasteners may be used to secure the cover 14 to the housing 12. Alternatively, the cover 14 may be secured directly to the electronic device (not shown) which in turn is fastened to the housing 12.

Referring to FIG. 2, the flange portion 26 substantially surrounds a perimeter portion of the body portion 24. In a preferred embodiment, the flange portion 26 is oriented along the top longitudinal side 28 of the body portion 24, the bottom longitudinal side 30 of the body portion 24, the first end wall portion 36 of the body portion 24, and the second end wall portion 38 of the body portion 24. The flange portion 26 oriented along the first end 32 of the body portion 24 extends from the first end wall portion 36 and the flange portion 26 oriented along the second end 34 of the body portion 24 extends from the second end wall portion 38.

Referring to FIGS. 1–2, the flange portion 26 is preferably angled with respect to the contact surface 22 of the housing 12. The flange portion 26 oriented along the top longitudinal side 28 of the body portion 24 is preferably angled at least about five degrees from the top wall 16 of the housing 12. The flange portion 26 oriented along the bottom longitudinal side 30 of the body portion 24 is preferably angled at least about five degrees, and for the embodiment shown, at least about ten degrees from the bottom wall 18 of the housing 12. The flange portion 26 oriented along first and second end wall portions 36, 38 of the body portion 24 is preferably angled at least about five degrees from the side wall 20 of the housing 12. The flange portion 26 is angled in this manner to allow the flange portion 26 to deflect when a force is applied in a direction substantially perpendicular to the body portion 24. The advantage of this arrangement is that the deflection of the flange portion 26 will form a positive contact between the flange portion 26 and the contact surface 22 even when the components are out of tolerance thereby preventing electromagnetic emissions from exiting the housing 12. The degree of the angle associated with the flange portion 26 may vary depending on the configuration of the housing 12, the configuration of the opening formed within the housing 12, and the configuration of the particular electronic device.

In a preferred embodiment, when the cover 14 is secured to the housing 12, the flange portion 26 oriented along the top longitudinal side 30 of the body portion 24 contacts the top wall 16 of the housing 12, the flange portion 26 oriented along the bottom longitudinal side 30 of the body portion 24 contacts the bottom wall 18 of the housing 12, and the flange portion 26 oriented along the first and second end wall portions 36, 38 contacts the side wall 20 of the housing 14.

The apparatus shown in FIGS. 1–5 is used for shielding electromagnetic emissions. A force is applied in a direction substantially perpendicular to the body portion 24. The force applied to the body portion 24 deflects the flange portion 26 and biases the flange portion 26 against the contact surface 22 of the housing 12 to form a positive contact between the flange portion 26 and the contact surface 22.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An electromagnetic interference (EMI) shield apparatus comprising:

a housing including an inner region and an opening formed therein, at least one electronic device positioned in the inner region, a portion of the at least one electronic device extending through the opening, the housing including a top wall including an inner surface, a bottom wall including an inner surface, and a side wall including an inner surface, a cover positioned in the inner region of the housing and secured to the inner region of the housing, the cover including a body portion, the body portion including a top longitudinal side, a bottom longitudinal side, a first end wall portion and a second end wall portion, a first deflectable flange portion extending continuously along the top longitudinal side for contacting the inner surface of the top wall of the housing, a second deflectable flange portion extending continuously along the bottom longitudinal side for contacting the inner surface of the bottom wall of the housing, a third deflectable flange portion extending continuously along the first end wall portion for contacting the inner surface of the side wall of the housing, and a fourth deflectable flange portion extending continuously along the second end wall portion for contacting the inner surface of the side wall of the housing to allow a force applied in a direction substantially perpendicular to the body portion to deflect the first, second, third and fourth deflectable flange portions and bias the first, second, third and fourth deflectable flange portions against the inner surface of the top wall, the inner surface of the bottom wall, and inner surface of the sidewall to form a positive contact between the first, second, third and fourth deflectable flange portions and the inner surface of the top wall, the inner surface of the bottom wall, and the inner surface of the sidewall thereby preventing electromagnetic radiation from exiting the housing.

2. The apparatus of claim 1 wherein the first deflectable flange portion is angled with respect to the inner surface of the top wall, the second deflectable portion is angled with respect to the inner surface of the bottom wall, and the third and fourth deflectable portions are each angled with respect to the inner surface of the side wall.

3. The apparatus of claim 2 wherein the first deflectable flange portion is angled at least about five degrees with respect to the inner surface of the top wall, the second deflectable portion is angled at least about ten degrees with respect to the inner surface of the bottom wall, and the third and fourth deflectable portions are each angled at least about five degrees with respect to the inner surface of the side wall.

4. The apparatus of claim 1 wherein the body portion includes an inner surface and an outer surface, and an insulative strip substantially covering the inner surface.

5. The apparatus of claim 4 wherein the insulative strip includes a front surface and a back surface, the back surface including an adhesive material for securing the insulative strip to the inner surface of the body portion.

6. A method for shielding electromagnetic interference (EMI) comprising the steps of:

providing a housing including an inner region and an opening formed therein for receiving a portion of at least one electronic device, the housing including a top wall including an inner surface, a bottom wall including an inner surface, and a side wall including an inner surface, a cover positioned in the inner region of the housing and secured to the inner region of the housing, the cover including a body portion, the body portion including a top longitudinal side, a bottom longitudinal side, a first end wall portion and a second end wall portion, a first deflectable flange portion extending continuously along the top longitudinal side for contacting the inner surface of the top wall of the housing, a second deflectable flange portion extending continuously along the bottom longitudinal side for contacting the inner surface of the bottom wall of the housing, a third deflectable flange portion extending continuously along the first end wall portion for contacting the inner surface of the side wall of the housing, and a fourth deflectable flange portion extending continuously along the second end wall portion for contacting the inner surface of the side wall of the housing;

applying a force in a direction substantially perpendicular to the body portion;

deflecting the first, second, third, and fourth deflectable flange portions;

biasing the first deflectable flange portion against the inner surface of the top wall;

biasing the second deflectable flange portion against the inner surface of the bottom wall; and biasing the third and fourth deflectable flange portions against the inner surface of the side wall to form a positive contact between the first, second third and fourth deflectable flange portions and the inner surface of the top wall, the inner surface of the bottom wall and the inner surface of the side wall thereby preventing electromagnetic radiation from exiting the housing.

7. The method of claim 6 further comprising:

providing at least one electronic device;

positioning the at least electronic device in the inner region of the housing;

extending a portion of the electronic device through the opening; and insulating the cover from the electronic device.

8. The method of claim 7 wherein the at least one electronic device is a liquid crystal display (LCD) assembly including a LCD; and preventing electromagnetic radiation from exiting through the LCD assembly.

* * * * *